(12) United States Patent
Jeong et al.

(10) Patent No.: US 9,136,342 B2
(45) Date of Patent: Sep. 15, 2015

(54) THIN FILM TRANSISTOR AND MANUFACTURING METHOD THEREOF

(71) Applicant: SAMSUNG DISPLAY CO., LTD., Yongin-City, Gyeonggi-Do (KR)

(72) Inventors: Yeon Taek Jeong, Seoul (KR); Bo Sung Kim, Seoul (KR); Doo-Hyoung Lee, Suwon-si (KR); June Whan Choi, Seoul (KR); Tae-Young Choi, Seoul (KR); Kano Masataka, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/495,835

(22) Filed: Sep. 24, 2014

(65) Prior Publication Data

US 2015/0008437 A1    Jan. 8, 2015

Related U.S. Application Data

(62) Division of application No. 13/436,689, filed on Mar. 30, 2012, now Pat. No. 8,871,577.

(30) Foreign Application Priority Data

Sep. 7, 2011    (KR) .................. 10-2011-0090618

(51) Int. Cl.
*H01L 29/76*    (2006.01)
*H01L 29/423*    (2006.01)
*H01L 29/51*    (2006.01)
(Continued)

(52) U.S. Cl.
CPC ...... *H01L 29/42384* (2013.01); *H01L 29/4908* (2013.01); *H01L 29/51* (2013.01); *H01L 29/512* (2013.01); *H01L 29/786* (2013.01); *H01L 2029/42388* (2013.01)

(58) Field of Classification Search
CPC .......................... H01L 29/4908; H01L 29/512
USPC ...................... 257/59, 72, 410, 411
See application file for complete search history.

(56) References Cited

U.S. PATENT DOCUMENTS

| 6,570,221 | B1 | 5/2003 | Allman |
| 7,226,806 | B2 | 6/2007 | Sakayori et al. |
| 7,369,435 | B2 | 5/2008 | Forbes |

(Continued)

FOREIGN PATENT DOCUMENTS

| JP | 2529141 B2 | 6/1996 |
| JP | 2004-088042 A | 3/2004 |

(Continued)

*Primary Examiner* — Mark Prenty
(74) *Attorney, Agent, or Firm* — Innovation Counsel LLP

(57) ABSTRACT

A thin film transistor is provided. A thin film transistor according to an exemplary embodiment of the present invention includes: a substrate; a gate line disposed on the substrate and including a gate electrode; a semiconductor layer disposed on the substrate and including at least a portion overlapping the gate electrode; a gate insulating layer disposed between the gate line and the semiconductor layer; and a source electrode and a drain electrode disposed on the substrate and facing each other over a channel region of the semiconductor layer. The gate insulating layer includes a first region and a second region, the first region corresponds to the channel region of the semiconductor layer, the first region is made of a first material, the second region is made of a second material, and the first material and the second material have different atomic number ratios of carbon and silicon.

9 Claims, 9 Drawing Sheets

(51) Int. Cl.
*H01L 29/49* (2006.01)
*H01L 29/786* (2006.01)

(56) References Cited

U.S. PATENT DOCUMENTS

| | | | |
|---|---|---|---|
| 7,915,075 B2 | 3/2011 | Suzawa et al. | |
| 8,058,115 B2 | 11/2011 | Do et al. | |
| 8,871,577 B2 * | 10/2014 | Jeong et al. | 438/158 |
| 2010/0051947 A1 | 3/2010 | Yabuta et al. | |
| 2010/0255633 A1 | 10/2010 | Cho et al. | |
| 2012/0244667 A1 | 9/2012 | Kim et al. | |

FOREIGN PATENT DOCUMENTS

| | | |
|---|---|---|
| JP | 2006-134959 A | 5/2006 |
| JP | 2011-065167 A | 3/2011 |
| KR | 10-0964773 B | 6/2010 |
| KR | 10-2010-0084063 A | 7/2010 |
| KR | 10-1020629 B | 3/2011 |

* cited by examiner

THIN FILM TRANSISTOR AND MANUFACTURING METHOD THEREOF

CROSS-REFERENCE TO RELATED APPLICATION

This application is a divisional application of U.S. application Ser. No. 13/436,689 filed on Mar. 30, 2012 which claims priority to, and the benefit of, Korean Patent Application No. 10-2011-0090618 filed in the Korean Intellectual Property Office on Sep. 7, 2011, the entire contents of which are incorporated herein by reference.

BACKGROUND OF THE INVENTION (a) Field of the Invention

Embodiments of the present invention relate generally to flat panel displays. More specifically, embodiments of the present invention relate to thin film transistors for use in flat panel displays, and manufacturing methods therefor.

(b) Description of the Related Art

In general, thin film transistors (TFTs) are used as switching elements in an image display device or a semiconductor device.

In a display device, the thin film transistor (TFT) is generally formed at an intersection of a gate wire and a data wire. The gate and data wires define unit pixel areas, and supply current for turning the unit pixel area on or off. In an on state, current flows such that a capacitor related to the corresponding unit pixel area is charged to a desired voltage, and in an off state, the charged state is maintained until the unit pixel area is next addressed. At this time, a voltage level determines an amount of light passing through a liquid crystal corresponding to the unit pixel area, thereby determining a gray level.

The thin film transistor may be used as a switching element for the liquid crystal display. Recently, the tendency toward large size liquid crystal displays and highly miniaturized circuitry has accelerated, requiring next generation processes for realization thereof.

Particularly, if very high resolution and a high speed driving are applied to a large size display, it is often desirable for RC delay to be reduced and the characteristics of the thin film transistor to be improved with regard to the driving of the panel. For this, a technique using an insulating layer having a low dielectric ratio to reduce parasitic capacitance between wires and to reduce the RC delay is applied, however, this may decrease on current in a channel region.

The above information disclosed in this Background section is only for enhancement of understanding of the background of the invention and therefore it may contain information that is not in the prior art.

SUMMARY OF THE INVENTION

The present invention provides a thin film transistor with an increased dielectric constant associated with its channel region, to increase its on current without increasing RC delay. Also disclosed is a manufacturing method therefor.

A thin film transistor according to an exemplary embodiment of the present invention includes: a substrate; a gate line disposed on the substrate and including a gate electrode; a semiconductor layer disposed on the substrate and including at least a portion overlapping the gate electrode; a gate insulating layer disposed between the gate line and the semiconductor layer; and a source electrode and a drain electrode disposed on the substrate and facing each other over a channel region of the semiconductor layer. The gate insulating layer includes a first region and a second region, the first region corresponds to the channel region of the semiconductor layer, the first region is made of a first material, the second region is made of a second material, and the first material and the second material have different atomic number ratios of carbon and silicon.

The atomic number ratio of carbon and silicon of the first material may be smaller than the atomic number ratio of carbon and silicon of the second material.

A dielectric constant of the first region may be larger than the dielectric constant of the second region.

A capacitance of the first region may be larger than the capacitance of the second region.

The gate insulating layer may be formed by using a solution type insulating material.

The solution type insulating material may include organo-siloxane or organo-silsequioxane.

The thickness of the first region of the gate insulating layer may be substantially the same as that of the second region of the gate insulating layer.

A thin film transistor manufacturing method according to another exemplary embodiment of the present invention includes: forming a gate line on a substrate; forming a gate insulating layer on the gate line; irradiating ultraviolet rays upon the gate insulating layer through a mask; heat treating the gate insulating layer; forming a semiconductor layer on the gate insulating layer; and forming a source electrode and a drain electrode on the semiconductor layer. In the irradiating, the ultraviolet rays are selectively irradiated upon a portion of the gate insulating layer corresponding to a channel region of the semiconductor layer.

The forming the gate insulating layer may further include coating a solution type of insulating material on the gate line.

The forming the gate insulating layer may further comprise forming the gate insulating layer with a spin coating method or an inkjet method.

The mask may include an opening part and a light blocking part, and the opening part may be disposed corresponding to a channel region of the semiconductor layer.

The gate insulating layer may include a first region to be irradiated by ultraviolet rays through the opening part, and a second region in which ultraviolet rays are to be blocked by the light blocking part. A carbon/silicon atomic number ratio of a first material forming the first region may be smaller than the carbon/silicon atomic number ratio of a second material forming the second region.

A thickness of the gate insulating layer may be substantially the same in the first region as in the second region.

The solution type of insulating material may include organo-siloxane or organo-silsequioxane.

The carbon/silicon atomic number ratio of the first material forming the first region may be smaller than the carbon/silicon atomic number ratio of the second material forming the second region.

A dielectric constant of the first region may be larger than the dielectric constant of the second region.

The capacitance of the first region may be larger than the capacitance of the second region.

As described above, according to an exemplary embodiment of the present invention, a portion of the gate insulating layer corresponding to the channel region is selectively irradiated with ultraviolet rays, such that the TFT's on current may be increased without increasing RC delay.

DETAILED DESCRIPTION OF EMBODIMENTS

Figure 1:
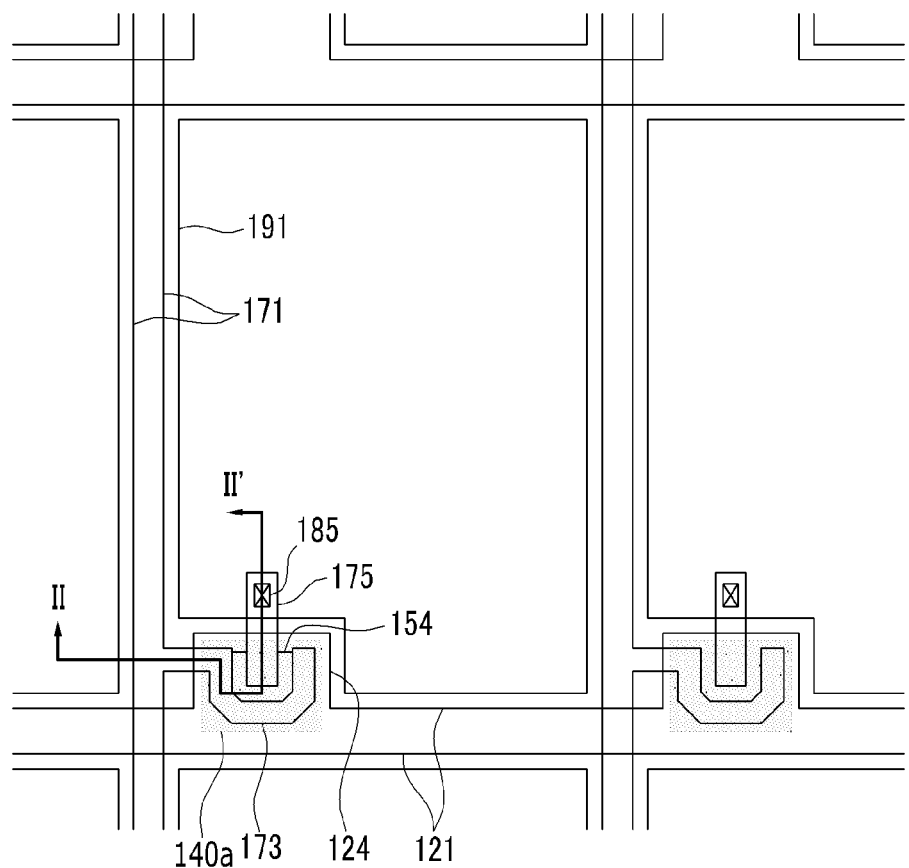
FIG. 1 is a top plan view of a thin film transistor according to an exemplary embodiment of the present invention.

Exemplary embodiments of the present invention will be described in detail with reference to the accompanying drawings. However, the present invention is not limited to exemplary embodiments described herein, and may be embodied in other forms. That is, exemplary embodiments described herein are provided to thoroughly and completely understand the disclosed contents and to sufficiently transfer the ideas of the present invention to a person of ordinary skill in the art.

In drawings, the thickness of layers and regions is exaggerated for clarity. It is to be noted that when a layer is referred to as being "on" another layer or substrate, it can be directly formed on another layer or substrate or can be formed on another layer or substrate through a third layer interposed therebetween. Like constituent elements are denoted by like reference numerals throughout the specification.

Figure 2:
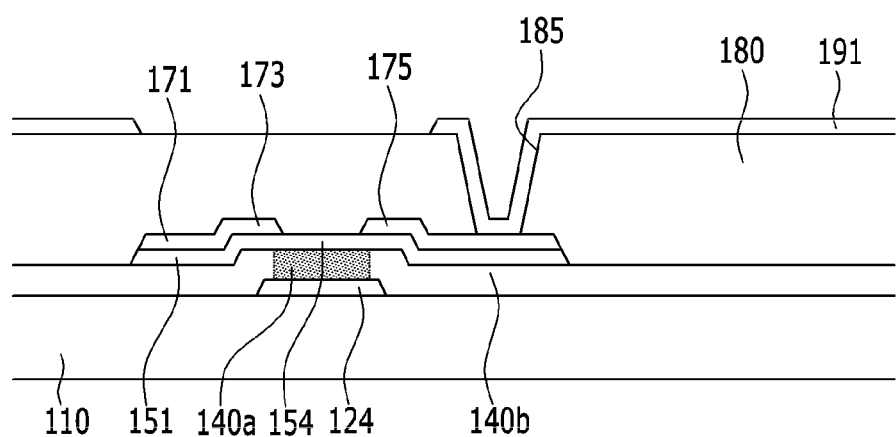
FIG. 2 and FIG. 3 are cross-sectional views taken along the line II-II' of FIG. 1.
Figure 3:
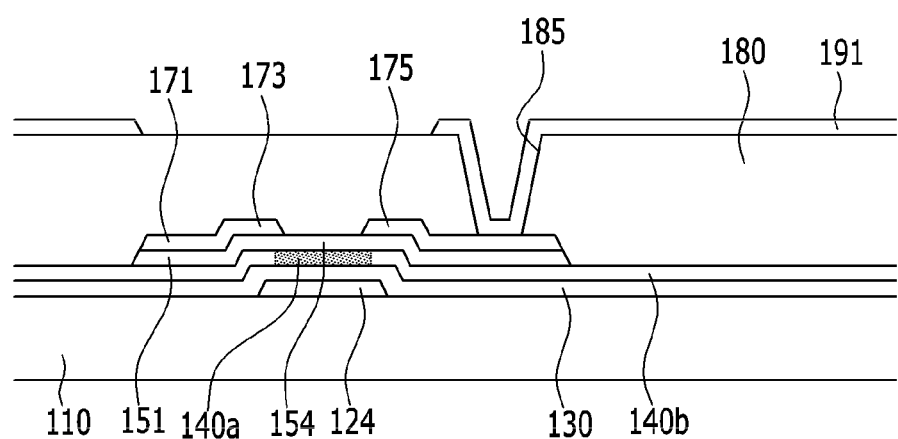

FIG. 1 is a top plan view of a thin film transistor according to an exemplary embodiment of the present invention. FIG. 2 and FIG. 3 are cross-sectional views taken along the line II-II' of FIG. 1.

Referring to FIG. 1 and FIG. 2, a plurality of gate lines 121 are formed on an insulation substrate 110 made of an optically transparent material such as a transparent glass or plastic.

The gate lines 121 transfer gate signals, and mainly extend in a transverse direction. Each gate line 121 includes a plurality of gate electrodes 124 protruding from the gate line 121.

Each gate line 121 and gate electrode 124 may be made of a material selected from an aluminum-containing metal of aluminum (Al) and aluminum alloys, a silver-containing metal of silver (Ag) and silver alloys, and a copper-containing metal of copper (Cu) and copper alloys.

In the present exemplary embodiment, the gate line 121 and the gate electrode 124 are formed as a single layer, however it is not limited thereto and they may each be made of multiple layers, such as a dual layer or a triple layer.

In the case of a dual-layer structure, the gate line 121 and the gate electrode 124 may be made of a lower layer and an upper layer, where the lower layer may be made of a material selected from a molybdenum-containing metal of molybdenum (Mo) and molybdenum alloys, chromium (Cr), chromium alloys, titanium (Ti), titanium alloys, tantalum (Ta), tantalum alloys, manganese (Mn), and manganese alloys. The upper layer may be made of a material selected from an aluminum-containing metal of aluminum (Al) and aluminum alloys, a silver-containing metal of silver (Ag) and silver alloys, and a copper-containing metal of copper (Cu) and copper alloys. In the case of a triple-layer structure, layers having different physical properties may be combined.

Gate insulating layers 140a and 140b are formed on the gate line 121. The gate insulating layers may include a first region 140a and a second region 140b. The first region 140a is disposed to correspond to a channel region of the semiconductor layer 154, and the second region 140b is disposed corresponding to most or all of the insulation substrate 110 excepting the first region 140a.

In the present exemplary embodiment, the thickness of the gate insulating layers 140a and 140b may be substantially uniform. In other words, the thicknesses of the first region 140a and the second region 140b may be substantially the same.

The gate insulating layers 140a and 140b can be formed by coating and heat-treating a solution of insulating material on the insulation substrate 110. The insulating material according to the present exemplary embodiment includes organo-siloxane or organo-silsequioxane. In the present exemplary embodiment, the insulating material may be an insulating material having a low dielectric ratio of less than 3.5.

The insulating material according to the present exemplary embodiment may include a methyl group (—CH3) that is combined with silicon (Si) or oxygen (O). Carbon that is combined with oxygen is disconnected by the heat treatment due to a weak combination force. However, the carbon that is combined to silicon has relatively strong combination energy, such that the combination is not disconnected after the heat treatment and is maintained in its current combination.

In the present exemplary embodiment, ultraviolet rays are selectively irradiated to the first region 140a of the gate insulating layer before the above-mentioned heat treatment, such that the first material forming the first region 140a and the second material forming the second region 140b have different chemical compositions. In the present exemplary embodiment, the first material and the second material have different atomic number ratios of carbon and silicon.

Carbon that is combined with silicon is disconnected by the irradiation of ultraviolet rays in the first region 140a. Accordingly, with the first material has a lower atomic number ratio of carbon to silicon, i.e. the ratio of the amount of carbon to the amount of silicon when each amount is measured in atomic numbers (also referred to as a carbon/silicon atomic number ratio), than the second material. Accordingly, as described above, the dielectric constant of the first region 140a may be larger than the dielectric constant of the second region 140b according to the difference in the carbon/silicon atomic number ratios of the two regions.

More specifically, the dielectric constant and thus the capacitance of the first region 140a are increased, so that the on current is increased. The second region 140b is formed of an insulating material having a lower dielectric constant, such that RC delay may be reduced by the reduction of parasitic capacitance.

A plurality of semiconductor layers 151 are formed on the gate insulating layers 140a and 140b. The semiconductor layers 151 mainly extend in a longitudinal direction, and include a plurality of projections 154 extending toward the gate electrodes 124.

The semiconductor layers 151 and 154 may be made of amorphous silicon, crystallized silicon, or an oxide semiconductor.

A plurality of data lines 171 (connected to a plurality of source electrodes 173) and a plurality of drain electrodes 175 are formed on the semiconductor layer 151.

Each data line 171 transmits a data signal and extends in the longitudinal direction thereby intersecting gate lines 121. Each data line 171 is connected to a plurality of source electrodes 173 having a "U" shape and extending toward the gate electrode 124.

The drain electrode 175 is separated from the data line 171 and extends in the center of the "U" shape of the source electrode 173. The shape of the source electrode 173 and the drain electrode 175 may be changed, and is not limited to the shapes and configurations shown.

The data line 171, the source electrode 173, and the drain electrode 175 may be made of a material selected from an aluminum-containing metal of aluminum (Al) and aluminum alloys, a silver-containing metal of silver (Ag) and silver alloys, and a copper-containing metal of copper (Cu) and copper alloys.

In the present exemplary embodiment, the data line 171, the source electrode 173, and the drain electrode 175 are formed as a single layer, however the invention is not limited thereto, and they may instead be formed as a dual layer or a triple layer.

In the case of a dual-layer structure, the data line 171, the source electrode 173, and the drain electrode 175 may be made of a lower layer and an upper layer, and the lower layer may be made of a material selected from a molybdenum-containing metal of molybdenum (Mo) and molybdenum alloys, chromium (Cr), chromium alloys, titanium (Ti), titanium alloys, tantalum (Ta), tantalum alloys, manganese (Mn), and manganese alloys. The upper layer may be made of a material selected from an aluminum-containing metal of aluminum (Al) and aluminum alloys, a silver-containing metal of silver (Ag) and silver alloys, and a copper-containing metal of copper (Cu) and copper alloys. In the case of the triple-layer structure, layers having different physical properties may be combined.

The projection 154 of the semiconductor layer 151 includes an exposed portion which is not covered by the data line 171, and the drain electrode 175 is disposed on this exposed portion, facing the source electrode 173. The semiconductor layer 151 has substantially the same planar pattern as the data line 171 and the drain electrode 175, except for the exposed portion of the projection 154. In other words, lateral walls (i.e., side edges) of the data line 171, the source electrode 173, and the drain electrode 175 may be substantially aligned with the lateral wall of the semiconductor layer 151 underlying them. These patterns are formed by patterning a data wire layer 171, 173, and 175 including the data line 171, the source electrode 173, and the drain electrode 175, as well as the semiconductor layer 151, using the same mask.

One gate electrode 124, one source electrode 173, and one drain electrode 175 collectively form one thin film transistor (TFT) along with the projection 154 of the semiconductor layer 151, and a channel of the thin film transistor is formed in the projection 154 between the source electrode 173 and the drain electrode 175.

A passivation layer 180 is formed on the data line 171, the drain electrode 175, and the projection 154 of the exposed semiconductor layer.

A plurality of pixel electrodes 191 are formed on the passivation layer 180. Each pixel electrode 191 is physically and electrically connected to its respective drain electrode 175 through a contact hole 185, thereby receiving a data voltage from the drain electrode 175.

An exemplary embodiment shown in FIG. 3 has most of the same constituent elements of FIG. 2, however an additional insulating layer 130 is formed under the gate insulating layers 140a and 140b. The insulating layer 130 may be formed of, for example, silicon nitride (SiNx) or silicon nitroxide (SiON). In other words, in the exemplary embodiment of FIG. 3, the gate insulating layer is formed as a dual-layered structure.

Hereinafter, a method of manufacturing a thin film transistor will be described with reference to FIG. 4 to FIG. 6.

Figure 4:
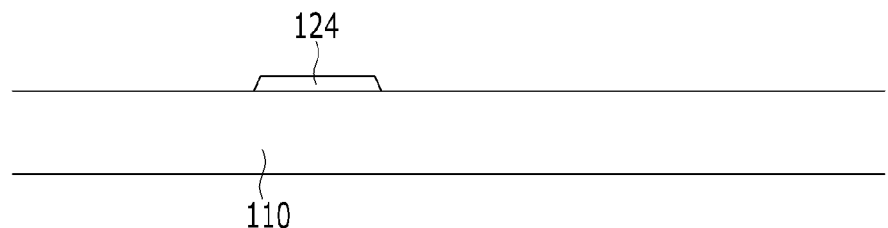
FIG. 4 to FIG. 6 are cross-sectional views of a manufacturing method of a thin film transistor according to another exemplary embodiment of the present invention.
Figure 5:
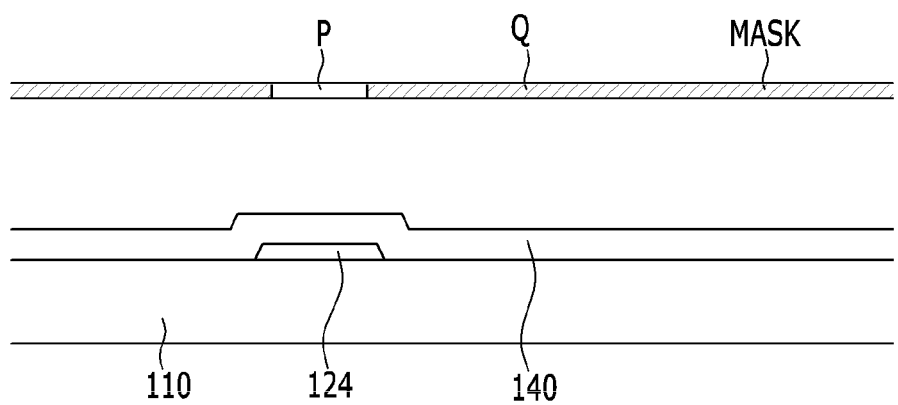
Figure 6:
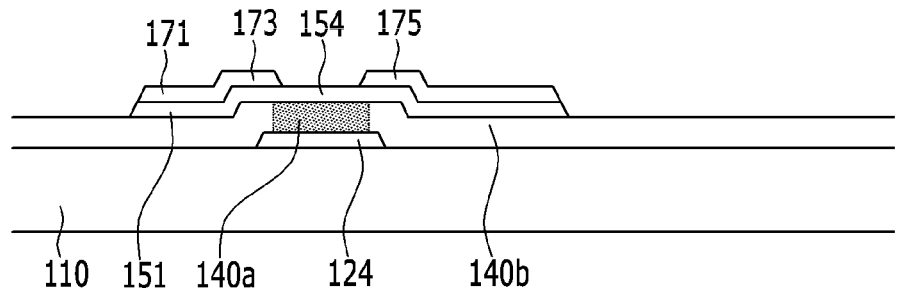

FIG. 4 to FIG. 6 are cross-sectional views of a method of manufacturing a thin film transistor according to another exemplary embodiment of the present invention.

Referring to FIG. 4, a gate conductive layer made of a metal having relatively low resistance, such as an aluminum-containing metal, a silver-containing metal, and/or a copper-containing metal, is deposited and patterned by photolithography on an insulation substrate 110. The substrate 110 can be made of a transparent material such as a transparent glass or plastic, to form a gate line including a plurality of gate electrodes 124.

Referring to FIG. 5, a solution type of insulating material 140 is coated on the insulation substrate 110 to cover the gate electrode 124. A spin coating method or an inkjet method may be used to coat the solution type of insulating material 140.

The solution type of insulating material 140 can include organo-siloxane or organo-silsequioxane.

A mask is aligned on the coated solution type of insulating material 140. The mask includes an opening part P and a light blocking part Q, and the opening part P of the mask is aligned to correspond to the gate electrode 124. Ultraviolet rays are irradiated onto the insulating material 140 through the mask, such that the solution type of insulating material disposed corresponding to the gate electrode 124 is selectively exposed to the ultraviolet rays.

In this manner, the solution type of insulating material is exposed to ultraviolet rays such that carbon that is combined with silicon is departed, i.e. at least some of the carbon is separated from the silicon to which it was bonded.

Referring to FIG. 6, after the irradiation of ultraviolet rays, the coated solution type of insulating material 140 is heat-treated to form a gate insulating layer including the first region 140a and the second region 140b. The first region 140a corresponds to the gate electrode 124. The combination of oxygen-carbon included in the solution type of insulating material 140 is disconnected by the heat treatment.

A semiconductor layer 151 and 154, a source electrode 173, and a drain electrode 175 are then formed on the gate insulating layers 140a and 140b. The semiconductor layer 154 of the thin film transistor is disposed with a portion corresponding to the gate electrode 124, and as a result, the semiconductor layer 154 corresponds to the first region 140a of the gate insulating layer.

The semiconductor layer 151 and 154, the source electrode 173, and the drain electrode 175 may be formed with substantially the same plane pattern by using one mask. In other words, the side walls of the data line 171, the source electrode 173, and the drain electrode 175 may each be substantially aligned with the corresponding side walls of the semiconductor layer 151.

Hereinafter, the above-described increase in on current and decrease in RC delay is described.

Figure 7:
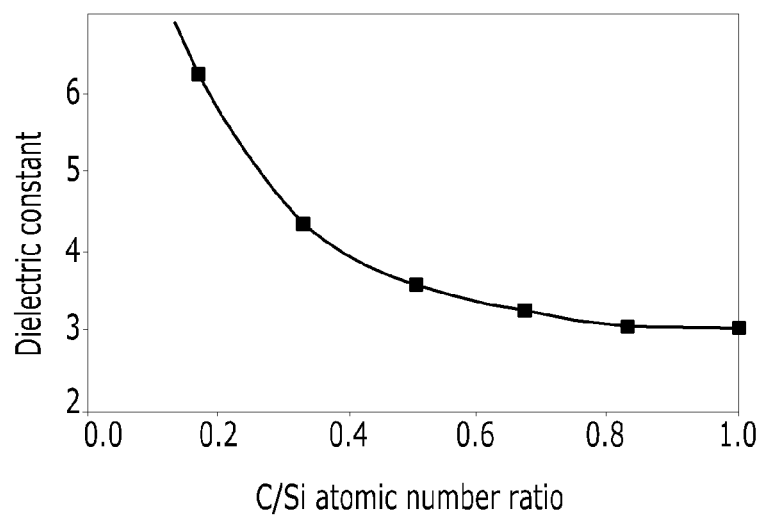
FIG. 7 is a graph showing a dielectric constant according to a carbon/silicon atomic number ratio.

FIG. 7 is a graph showing a dielectric constant according to a carbon/silicon atomic number ratio.

Referring to FIG. 7, it may be confirmed that the dielectric constant decreases with increase in the atomic number ratio of the carbon/silicon.

One example of the solution type of insulating material according to the present exemplary embodiment may be represented by Chemical Formula 1 below. A compound represented by Chemical Formula 1 includes a first combination a of silicon and carbon and a second combination b of oxygen and carbon. According to an exemplary embodiment of the present invention, when the heat treatment is applied, the first combination a is maintained, however the second combination b is mostly disconnected. According to an exemplary embodiment of the present invention, the first region of the gate insulating layer corresponding to the channel region is irradiated with ultraviolet rays to disconnect the first combination a, such that the carbon/silicon atomic number ratio of the first region is decreased. Accordingly, in the channel region corresponding to the first region, the dielectric constant and the capacitance are increased, and thereby the on current may be increased.

[Chemical Formula 1]

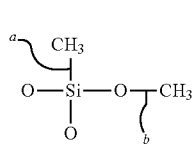

Figure 8:
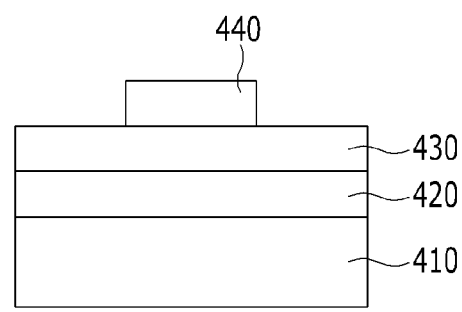
FIG. 8 is a cross-sectional view of a capacitor according to an exemplary embodiment of the present invention.

FIG. 8 is a cross-sectional view of a capacitor structure according to an exemplary embodiment of the present invention.

Referring to FIG. 8, a silicon oxide layer 420 having a thickness of 1000 Å is formed on a P-type wafer 410, as in Table 1, and the solution type of insulating materials corresponding to five exemplary embodiments SGI A, SGI B, SGI C, SGI D, and SGI E) are spin-coated on the silicon oxide layer 420. Next, ultraviolet rays having a main wavelength of 254 nm and a secondary wavelength 180 nm are irradiated for 0 minutes, 30 minutes, and 60 minutes. Next, a heat treatment is executed for about one hour in a furnace at 250 degrees Celsius and with a nitrogen atmosphere. Next, a metal electrode layer 440 of 0.023 cm2 is formed on an insulating layer 430 to form a capacitor comprising metal layer 440, dielectric layers 430 and 420, and silicon layer 410, and then each capacitance is measured.

Table 1 shows the capacitance of the capacitor in pF. Table 2 only shows a capacitance $C_{SGI}$ of the insulating layer in the entire capacitance Ctotal, to confirm an influence of the ultraviolet ray irradiation on the capacitance value of the insulating layer.

Differences may be generated, however, in all five exemplary embodiments, and it may be confirmed that the capacitance is increased as the irradiation time of ultraviolet rays is increased.

TABLE 1

| SGI type | UV | | |
|---|---|---|---|
| | 0 min | 30 min | 60 min |
| SGI A | 350.2 pF | 380.9 pF | 397.3 pF |
| SGI B | 121.7 pF | 283.9 pF | 548.7 pF |
| SGI C | 222.6 pF | 545.9 pF | 563.2 pF |
| SGI D | 269.8 pF | 387.0 pF | 442.2 pF |
| SGI E | 229.7 pF | 517.9 pF | 637.1 pF |

Figure 9:
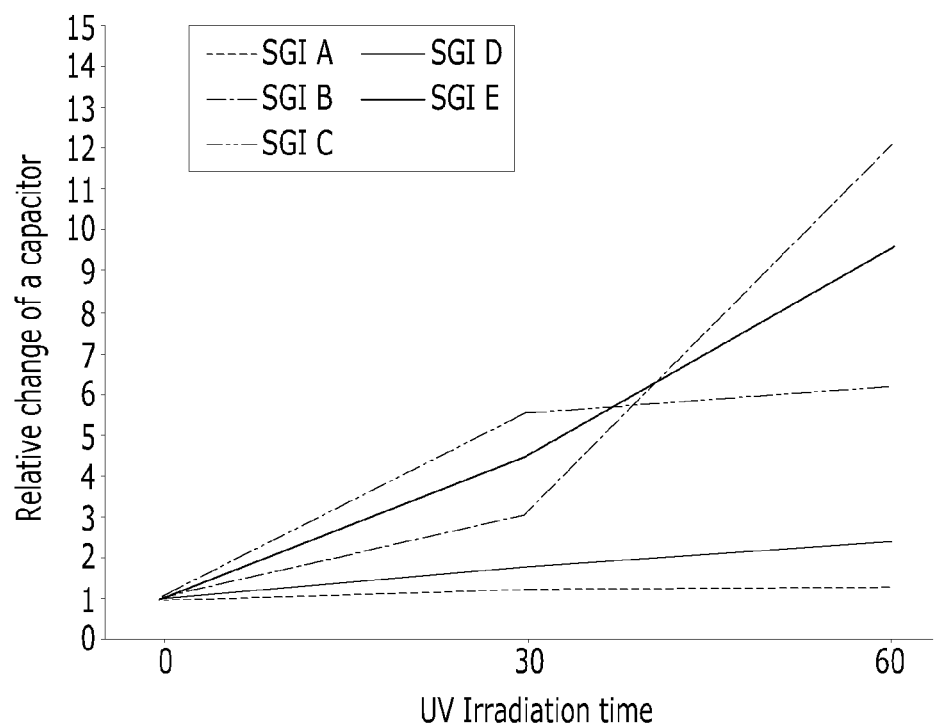
FIG. 9 is a graph showing a relative change of a capacitance according to an ultraviolet ray irradiation time.

FIG. 9 is a graph showing a relative change in capacitance according to an irradiation time of ultraviolet rays.

Referring to FIG. 9, as the irradiation time of ultraviolet rays is increased, the capacitance is also increased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 110 insulation substrate | 121 gate line |
| 140a, 140b first region | 151 semiconductor layer |
| 154 projection of a semiconductor layer | |
| 171 data line | 173 source electrode |
| 175 drain electrode | 180 passivation layer |

What is claimed is:

1. A thin film transistor comprising:
a substrate;
a gate line disposed on the substrate and comprising a gate electrode;
a semiconductor layer disposed on the substrate and comprising at least a portion overlapping the gate electrode;
a gate insulating layer disposed between the gate line and the semiconductor layer; and
a source electrode and a drain electrode disposed on the substrate and facing each other over a channel region of the semiconductor layer,
wherein the gate insulating layer comprises a first region and a second region, and the first region corresponds to the channel region of the semiconductor layer; and
wherein the first region is made of a first material having a first atomic number ratio of carbon to silicon, the second region is made of a second material having a second atomic number ratio of carbon to silicon, and the first atomic number ratio is smaller than the second atomic number ratio.

2. The thin film transistor of claim 1, wherein
a dielectric constant of the first region is larger than the dielectric constant of the second region.

3. The thin film transistor of claim 2, wherein
a capacitance of a capacitor including the first region is larger than the capacitance of a capacitor including the second region.

4. The thin film transistor of claim 3, wherein
the gate insulating layer is formed by using a solution type of insulating material.

5. The thin film transistor of claim 4, wherein
the solution type insulating material comprises organo-siloxane or organo-silsequioxane.

TABLE 2

| SGI type | $C_{total}$ (pF/orf) | | | $C_{sio2}$ (pF/orf) | $C_{SGI}$ (pF/orf) | | | $C_{SGI}$ | | |
|---|---|---|---|---|---|---|---|---|---|---|
| | 0 min | 30 min | 60 min | ** | 0 min | 30 min | 60 min | 0 min | 30 min | 60 min |
| SGI A | 15094.8 | 16418.1 | 17125.0 | 34530.6 | 26818.3 | 31300.3 | 33973.9 | 1.0 | 1.2 | 1.3 |
| SGI B | 5245.7 | 12237.1 | 23650.9 | 34530.6 | 6185.3 | 18954.1 | 75064.2 | 1.0 | 3.1 | 12.1 |
| SGI C | 9594.8 | 23530.2 | 24275.9 | 34530.6 | 13286.7 | 73861.8 | 81743.7 | 1.0 | 5.6 | 6.2 |
| SGI D | 11629.3 | 16681.0 | 19060.3 | 34530.6 | 17534.7 | 32270.0 | 42543.9 | 1.0 | 1.8 | 2.4 |
| SGI E | 9900.9 | 22323.3 | 27461.2 | 34530.6 | 13880.9 | 63145.4 | 134134.8 | 1.0 | 4.5 | 9.7 |

6. The thin film transistor of claim 1, wherein a thickness of the first region of the gate insulating layer is substantially the same as that of the second region of the gate insulating layer.

7. The thin film transistor of claim 1, wherein the gate insulating layer comprises organo-siloxane or organo-silsequioxane.

8. The thin film transistor of claim 7, wherein a capacitance of a capacitor including the first region is larger than a capacitance of a capacitor including the second region.

9. A thin film transistor comprising:

a substrate;

a gate line disposed on the substrate and including a gate electrode;

a semiconductor layer disposed on the substrate and including at least a portion overlapping the gate electrode;

a gate insulating layer disposed between the gate line and the semiconductor layer; and a source electrode and a drain electrode disposed on the substrate and facing each other over a channel region of the semiconductor layer, wherein the gate insulating layer includes a first region and a second region, and the first region corresponds to a channel region of the semiconductor layer; and wherein the first region and the second region are disposed at a same level, a thickness of the gate insulating layer is substantially the same in the first region as in the second region, and an atomic number ratio of carbon to silicon for the first region is smaller than an atomic number ratio of carbon to silicon for the second region, so that dielectric constants of the first region and the second region are different from each other.

* * * * *